United States Patent
Zhou et al.

(10) Patent No.: US 6,358,842 B1
(45) Date of Patent: Mar. 19, 2002

(54) METHOD TO FORM DAMASCENE INTERCONNECTS WITH SIDEWALL PASSIVATION TO PROTECT ORGANIC DIELECTRICS

(75) Inventors: Mei-Sheng Zhou; Simon Chooi; Yi Xu, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/633,770

(22) Filed: Aug. 7, 2000

(51) Int. Cl.$^7$ .......................................... H01L 21/3205
(52) U.S. Cl. ...................... 438/633; 438/596; 438/692; 438/627; 438/628; 438/634; 438/597; 438/706; 438/708; 438/624; 438/626
(58) Field of Search .................... 438/596, 99, 692, 438/627, 628, 633, 706, 708, 624, 626, 634, 597

(56) References Cited

U.S. PATENT DOCUMENTS

| | | | |
|---|---|---|---|
| 5,536,681 A | | 7/1996 | Jang et al. .................. 437/195 |
| 5,540,812 A | * | 7/1996 | Kadomura ............... 156/652.1 |
| 5,759,906 A | | 6/1998 | Lou ............................ 438/623 |
| 5,821,168 A | * | 10/1998 | Jain ........................... 438/692 |
| 5,976,626 A | | 11/1999 | Matsubara et al. ......... 427/307 |
| 5,985,762 A | | 11/1999 | Geffken et al. ............. 438/687 |
| 6,024,887 A | * | 2/2000 | Kuo et al. .................... 216/48 |
| 6,100,181 A | * | 8/2000 | You et al. ................... 438/633 |
| 6,100,184 A | * | 8/2000 | Zhao et al. ................. 438/638 |
| 6,150,723 A | * | 11/2000 | Harper et al. ............... 257/762 |
| 6,194,321 B1 | * | 2/2001 | Moore et al. ............... 438/706 |

FOREIGN PATENT DOCUMENTS

JP     405299762 A  *  4/1992  ............. H01S/3/18

* cited by examiner

*Primary Examiner*—Matthew Smith
*Assistant Examiner*—V. Yevsikov
(74) *Attorney, Agent, or Firm*—George O. Saile; Rosemary L. S. Pike (57) ABSTRACT

A new method of forming a damascene interconnect in the manufacture of an integrated circuit device has been achieved. The damascene interconnect may be a single damascene or a dual damascene. Copper conductors are provided overlying a semiconductor substrate. A first passivation layer is provided overlying the copper conductors. A low dielectric constant layer is deposited overlying the first passivation layer. An optional capping layer is deposited overlying the low dielectric constant layer. A photoresist layer is deposited overlying the capping layer. The capping layer and the low dielectric constant layer are etched through to form via openings. The photoresist layer is simultaneously stripped away while forming a sidewall passivation layer on the sidewalls of the via openings using a sulfur-containing gas. Sidewall bowing and via poisoning are thereby prevented. The first passivation layer is etched through to expose the underlying copper conductors. A copper layer is deposited overlying the capping layer and filling the via openings. The copper layer is polished down to complete the damascene interconnects in the manufacture of the integrated circuit device.

30 Claims, 7 Drawing Sheets

METHOD TO FORM DAMASCENE INTERCONNECTS WITH SIDEWALL PASSIVATION TO PROTECT ORGANIC DIELECTRICS

BACKGROUND OF THE INVENTION (1) Field of the Invention

The invention relates to a method of fabricating semiconductor structures, and more particularly, to the formation of damascene interconnects using low dielectric constant materials in the manufacture of integrated circuit devices.

(2) Description of the Prior Art

With the continuing reduction in the feature size in the art of semiconductor manufacture, conductive traces and active devices are now fabricated very closely together. This greater proximity has led to the tremendous packing densities of modern ultra large-scale integration (ULSI). With these greater densities and closer device spacings has come the problem of greater capacitive coupling between adjacent circuit elements.

To reduce the capacitive coupling between elements in the circuit, while still achieving the essential electrical isolation, new dielectric materials have been developed and introduced into integrated circuit manufacturing. These new materials typically are based on organic compounds that may also contain inorganic elements, such as silicon. For example, spin-on-glass (SOG) materials, such as silsesquioxane have been introduced. Amorphous carbon dielectric materials and organic polymers have also been applied in place of silicon dioxide. These new materials reduce the dielectric constant of the insulating layer formed, thus improving circuit performance.

There are many difficulties to overcome in using these new materials, however. One problem of particular concern is stripping photoresist. Traditional methods and chemistries used for stripping etching these new materials encounter problems as will be seen in the prior art example.

Figure 1:
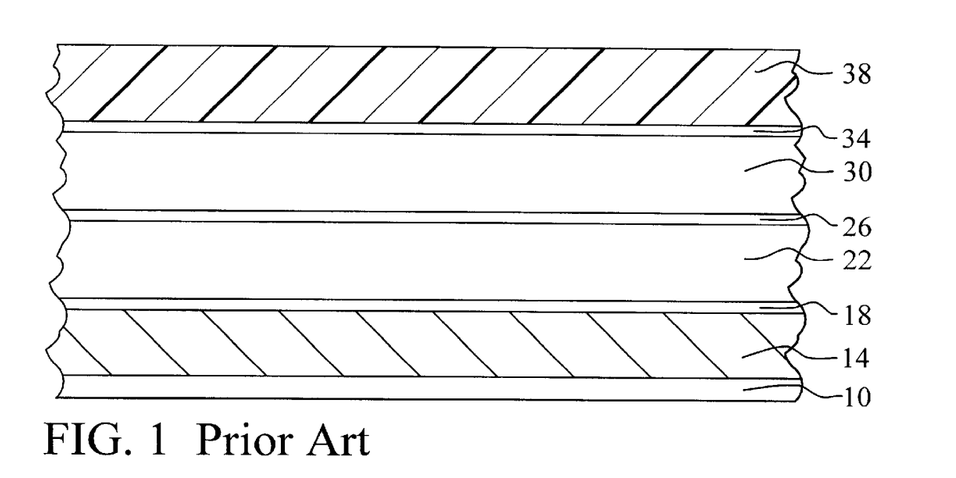
FIGS. 1 through 3 schematically illustrate in cross-section a partially completed prior art integrated circuit device.

Referring to FIG. 1, a cross-section of a partially completed prior art integrated circuit device is shown. In this example, a dual damascene via is being formed. A semiconductor substrate 10 is shown. The semiconductor substrate 10 could be composed of silicon or of several microelectronics layers such as insulator layers and conductor layers. Metal traces 14 are formed overlying the semiconductor substrate 10. A passivation layer 18 overlies and isolates the metal traces 14. A first low dielectric constant layer 22 is applied overlying the passivation layer 18. The first low dielectric constant layer 22 comprises either an organic material or a carbon-doped silicon dioxide. An etch stop layer 26 overlies the first low dielectric constant material 22. A second low dielectric constant material 30 overlies the etch stop layer 26. The second low dielectric constant layer 30 also comprises either an organic material or a carbon-doped silicon dioxide. A capping layer 34 overlies the second low dielectric constant layer 30. Finally, a photoresist layer 38 is applied overlying the capping layer 34.

Figure 2:
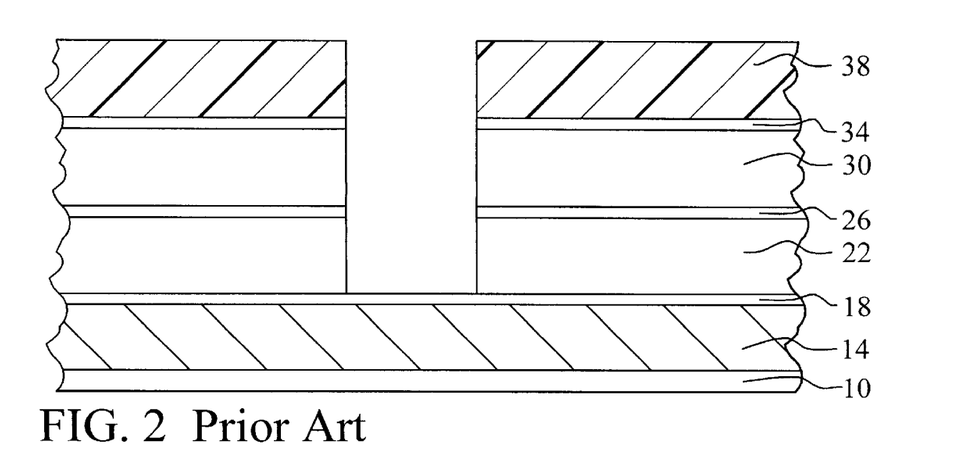

Referring now to FIG. 2, the photoresist layer 38 is patterned to form openings where vias for the dual damascene interconnects are planned. The capping layer 34, second low dielectric constant layer 30, etch stop layer 26, and the first low dielectric constant layer 22 are etched through using the photoresist layer 38 pattern as a mask.

Figure 3:
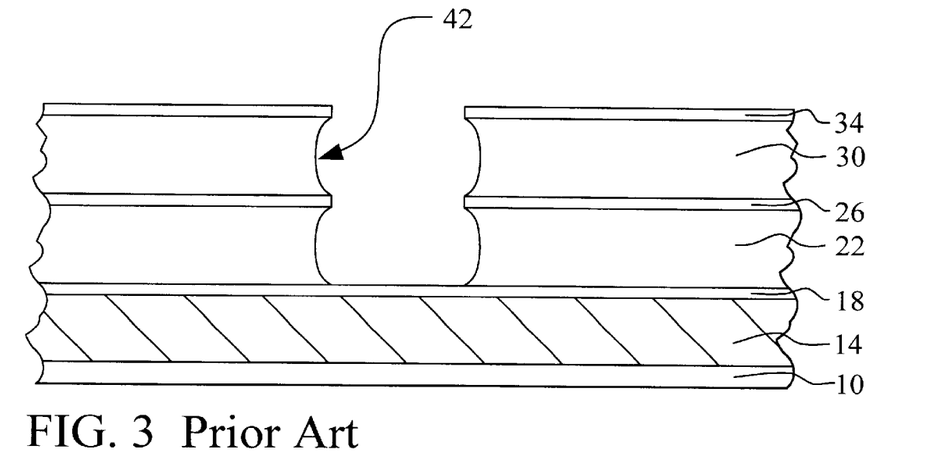

Referring now to FIG. 3, the photoresist layer 38 is stripped away. A serious problem in the prior art method is illustrated. The photoresist stripping process can attack the first low dielectric constant layer 22 and the second low dielectric constant layer 30. A significant amount of the low dielectric constant material can be removed, resulting in the bowing profile 42 shown.

Photoresist is typically stripped by a wet solvent or by an oxygen plasma. Unfortunately, wet solvents can attack interfaces. The oxygen plasma, or ashing, approach is more frequently used to avoid this problem. Oxygen plasmas do not typically damage silicon dioxide dielectric layers. However, the carbon and hydrogen containing low dielectric constant materials are susceptible to attack by the oxygen radicals in the plasma. The bowing damage caused by the oxygen strip is not repairable. It leads to poor damascene copper fill and to via poisoning problems.

Several prior art approaches disclose methods to form interconnecting structures in the fabrication of integrated circuits. U.S. Pat. No. 5,536,681 to Jang et al discloses a process to improve the gap filling capability of $O_3$-TEOS. A selective plasma $N_2$ treatment is performed on a PE-OX layer to reduce the $O_3$-TEOS deposition rate and thereby improve the gap fill capability. U.S. Pat. No. 5,759,906 to Lou teaches a method to improve planarization and to eliminate via poisoning in a multiple level metal process. A triple bake sequence is performed on the spin-on-glass (SOG) layer to improve planarization. A high-density plasma fluorinated silicon glass (HDP-FSG) layer is deposited. The HDP-FSG layer is anisotropically etched to form sidewall spacers on the via sidewalls. The presence of the HDP-FSG sidewall spacers eliminates via poisoning. U.S. Pat. No. 5,985,762 to Geffken et al discloses a method to form a copper barrier layer on the sidewalls of vias to prevent via poisoning. The barrier material is bulk deposited and then anisotropically etched to form the sidewall liner. U.S. Pat. No. 5,976,626 to Matsubara et al teaches a method to improve the crack resistance and to eliminate via poisoning. Various thermal treatments are disclosed.

SUMMARY OF THE INVENTION

A principal object of the present invention is to provide an effective and very manufacturable method of forming damascene interconnects in the manufacture of integrated circuits.

A further object of the present invention is to provide a method to form single and dual damascene interconnects where low dielectric constant materials are used.

A yet further object of the present invention is to provide a method to strip photoresist after trench etch such that a sidewall passivation is formed to line the trench.

Another yet another further object of the present invention is to provide a method to form a sidewall passivation that protects the low dielectric constant materials from oxygen plasma damage.

Another yet further object of the present invention is to provide a method to strip photoresist using a sulfur-containing gas that simultaneously forms a sidewall passivation.

In accordance with the objects of this invention, a new method of forming a damascene interconnect in the manufacture of an integrated circuit device has been achieved. The damascene interconnect may be a single damascene or a dual damascene. Copper conductors are provided overlying a semiconductor substrate. A first passivation layer is provided overlying the copper conductors. A low dielectric constant layer is deposited overlying the first passivation layer. An optional capping layer is deposited overlying the low dielectric constant layer. A photoresist layer is deposited overlying the capping layer. The capping layer and the low dielectric constant layer are etched through to form via openings. The photoresist layer is simultaneously stripped away while forming a sidewall passivation layer on the sidewalls of the via openings using a sulfur-containing gas. Sidewall bowing and via poisoning are thereby prevented. The first passivation layer is etched through to expose the underlying copper conductors. A barrier metal layer is deposited overlying the first passivation layer and the underlying copper conductors and lining the via openings. A copper layer is deposited overlying the capping layer and filling the via openings. The copper layer is polished down to complete the damascene interconnects in the manufacture of the integrated circuit device.

BRIEF DESCRIPTION OF THE DRAWINGS

In the accompanying drawings forming a material part of this description, there is shown.

DESCRIPTION OF THE PREFERRED EMBODIMENTS

This embodiment discloses the application of the present invention to forming damascene interconnects with low dielectric constant materials in the fabrication of an integrated circuit device. In particular, organic material or carbon-doped silicon dioxide are preferably used as the low dielectric constant materials. It should be clear to those experienced in the art that the present invention can be applied and extended, for example, to new, but similar, compounds that are developed or applied to semiconductor manufacture. The preferred embodiment describes the application of the present invention to the formation of both single and dual damascene interconnects. It should be clear to those skilled in the art that the present invention can easily be applied to various damascene schemes. The present invention could be applied to many applications where photoresist must be stripped from an integrated circuit that contains an exposed low dielectric constant material.

Figure 4:
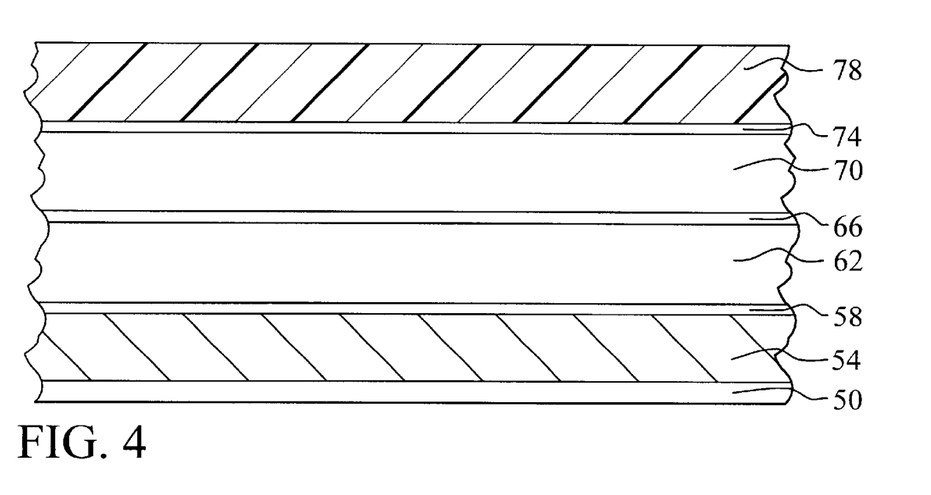
FIGS. 4 through 8 schematically illustrate in cross-sectional representation the preferred embodiment of the present invention applied to the fabrication of a single damascene interconnect.

Referring now particularly to FIG. 4, there is shown a cross section of a partially completed integrated circuit device of the preferred embodiment. A single damascene via will first be used to demonstrate the present invention. A semiconductor substrate 50 is provided. To simplify the illustration, the semiconductor substrate 50 is shown as a single layer. The base of the semiconductor substrate 50 preferably comprises monocrystalline silicon. The semiconductor substrate 50 may additionally comprise any of the several additional microelectronics layers, such as conductive layers and insulator layers, interconnect structures such as vias, contact holes, and conductive lines, and device structures, such as gate electrodes and doped junctions.

Copper conductors 54 are formed overlying the semiconductor substrate 50. It is understood that typically an insulating layer, which is not shown, would separate the copper conductors 54 from the semiconductor substrate 50. The insulating layer may additionally comprise a barrier metal layer or may only comprise a barrier metal layer. It is also understood that the copper conductors 54 may be part of a dual damascene or single damascene interconnect structure, which is not shown. The copper conductors 54 may be formed in any of the known methods. For example, a copper layer 54 is deposited by a sequence of physical vapor deposition (PVD), electroplating, and chemical mechanical polishing (CMP). The copper layer 54 is then patterned to form copper conductors. A first passivation layer 58 is deposited overlying the copper conductors 54. The purpose of the first passivation layer 58 is to prevent out diffusion of copper from the copper conductors 54 into overlying dielectric materials. The first passivation layer 58 preferably comprises silicon nitride that is deposited to a thickness of between about 500 Angstroms and 5,000 Angstroms. Alternative first passivation layer 58 materials include, but are not restricted to, silicon oxynitride, BLok by Applied Materials Corp., silicon carbide, and boron nitride.

A first low dielectric constant layer 62 is deposited overlying the first passivation layer 58. The purpose of the first low dielectric constant layer 62 is to provide a dielectric barrier for the subsequently formed single damascene interconnects. In addition, by using a material with a low dielectric constant, the capacitance loading and coupling problems can be minimized. The first low dielectric constant layer 62 preferably comprises organic material, carbon-doped silicon dioxide, or hydrogen-doped silicon dioxide. Alternatively, undoped silicon dioxide or fluorinated silicon dioxide may be used. Material types that fall under these descriptions and that could be used to form the first low dielectric constant layer 62 include, but are not limited to: porous organic materials, non-porous organic materials, porous fluorinated organic materials, non-porous fluorinated organic materials, porous hydrogen-doped silicon dioxide, non-porous hydrogen-doped silicon dioxide, porous carbon-doped silicon dioxide, and non-porous carbon-doped silicon dioxide. Specific materials include, but are not limited to: poly(arlene) ether or SILK™ by Dow Chemical Corp., fluorinated arylether or FLARE™ by Allied Signal Corp. or Honeywell Corp., amorphous fluorocarbon (α-C:F), polytetrafluoroethylene (PTFE™) or Teflon™ by Dupont Corp., parylene-F, parylene, alkyl silsesquioxane, aryl silsesquioxane, poly(silazane), poly(arylene)ether, silica doped with methane or Black Diamond™ by Applied Materials Corp., carbon doped silicon dioxide or Coral™ by Novellus Corp., fluorinated poly(arylene) ether, and hydrogen silsesquioxane. The first low dielectric constant layer 62 may be deposited by spin coating. The spin coating may be followed by aging or by a thermal treatment in a furnace or in rapid thermal annealing (RTA) equipment. The first low dielectric constant layer 62 is preferably deposited to a thickness of between about 2,000 Angstroms and 10,000 Angstroms.

An etch stop layer 66 is deposited overlying the first low dielectric constant layer 62. The etch stop layer 66 is optional to the essential method of the present invention. The etch stop layer 66 is not necessary to the formation of the single damascene interconnect, however, the dual damascene trench etching method of the preferred embodiment uses this etch stop layer 66 to facilitate creation of the upper level, or interconnect, trenches. The etch stop layer 66 may comprise, but is not limited to, silicon nitride, silicon oxynitride, copper barrier low k film or Blok™ by Applied Materials Corp., silicon carbide, or boron nitride. The etch stop layer 66 preferably comprises silicon nitride that is deposited by CVD. The etch stop layer 66 is deposited to a thickness of between about 500 Angstroms and 5,000 Angstroms.

A second low dielectric constant layer 70 is deposited overlying the etch stop layer 66. The purpose of the second low dielectric constant layer 70 is to provide a dielectric barrier for the subsequently formed single damascene interconnects. As with the first low dielectric constant layer 62, capacitance loading and coupling problems are minimized by the material. In the formation of the single damascene interconnect, the second low dielectric layer 70 is not necessary. The second low dielectric constant layer 70 preferably comprises organic material, carbon-doped silicon dioxide, or hydrogen-doped silicon dioxide. Alternatively, undoped silicon dioxide or fluorinated silicon dioxide may be used. Materials types that fall under these description and that could be used to form the second low dielectric constant layer 70 include, but are not limited to: porous organic materials, non-porous organic materials, porous fluorinated organic materials, non-porous fluorinated organic materials, porous hydrogen-doped silicon dioxide, non-porous hydrogen-doped silicon dioxide, porous carbon-doped silicon dioxide, and non-porous carbon-doped silicon dioxide. Specific materials include, but are not limited to: poly (arlene) ether or SiLK™ by Dow Chemical Corp., fluorinated arylether or FLARE™ by Allied Signal Corp. or Honeywell Corp., amorphous fluorocarbon (α-C:F), polytetrafluoroethylene (PTFE) or Teflon™ by Dupont Corp., parylene-F, parylene, alkyl silsesquioxane, aryl silsesquioxane, poly(silazane), poly(arylene)ether, silica doped with methane or Black Diamond™ by Applied Materials Corp., carbon doped silicon dioxide or Coral™ by Novellus Corp., fluorinated poly(arylene) ether, and hydrogen silsesquioxane. The second low dielectric constant layer 70 may be deposited by spin coating. The spin coating may be followed by aging or by a thermal treatment in a furnace or in rapid thermal annealing (RTA) equipment. The second low dielectric constant layer 70 is preferably deposited to a thickness of between about 2,000 Angstroms and 10,000 Angstroms.

A capping layer 74 is deposited overlying the second low dielectric constant layer 70. This capping layer is optional to the essential features of the present invention. If used, the capping layer 74 may serve two purposes in the embodiment. First, the capping layer 74 protects the second low dielectric constant layer 70 from contamination, particularly from copper, during the processing sequence. Second, the capping layer 74 may be used as a polishing stop during the polish down of the copper layer. The capping layer 74 preferably comprises silicon nitride, silicon oxynitride, or silicon carbide that has been deposited by CVD to a thickness of between about 500 Angstroms and 5,000 Angstroms.

As an important feature, an organic photoresist layer 78 is deposited overlying the capping layer 74. An optional organic bottom anti-reflective coating (BARC) may also be applied. The photoresist layer 78 will be patterned to form a mask for the vias or trenches. The photoresist layer 74 may comprise one of the several light sensitive compounds that are commonly used in the art.

Figure 5:
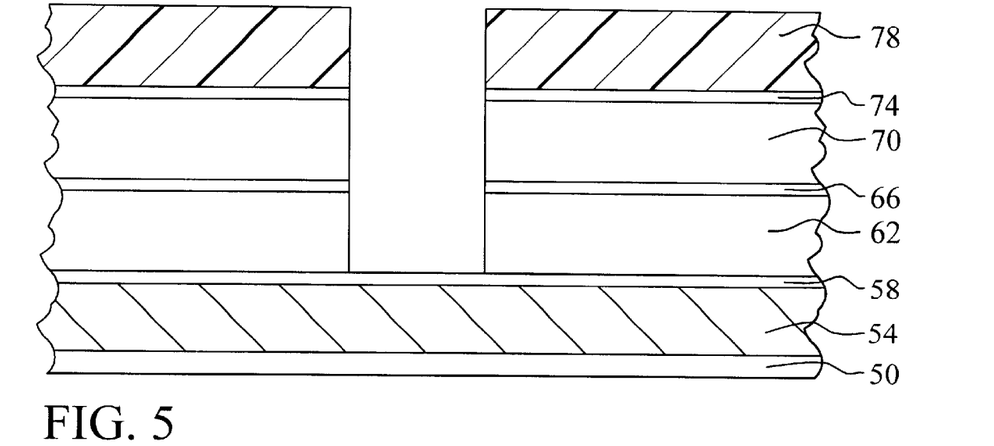

Referring now to FIG. 5, another important feature is illustrated. The photoresist layer 78 is patterned to form openings where vias or trenches are planned for the single damascene interconnects. The photoresist layer 78 may be patterned using a typical photolithographic process where it is exposed to light through a mask. A developing process removes the undesired photoresist layer 78 to expose the capping layer 74, or the optional BARC layer, where the vias or trenches are planned.

The optional BARC layer, the optional capping layer 74, the second low dielectric constant layer 70, the optional etch stop layer 66, and the first low dielectric constant layer 62 are etched through to form the vias or trenches. This etching is performed using an anisotropic plasma-assisted dry etch. Note that the etch is stopped at the first passivation layer 58. By stopping the etch at the first passivation layer 58, the copper conductors 54 are not yet exposed. This is an important feature of the present invention because the copper material of the copper conductors 54 remains encapsulated by the first passivation layer 58. This prevents copper out-diffusion into the low dielectric constant materials.

Figure 6:
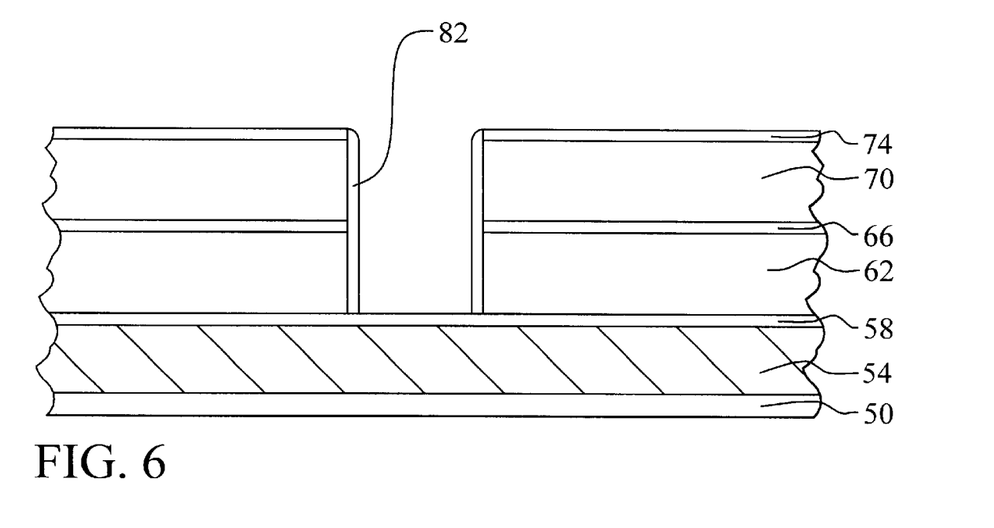

Referring now to FIG. 6, an important aspect of the present invention is described. The photoresist layer 78 is stripped away while a first sidewall passivation layer 82 is formed on the sidewalls of the vias or trenches.

As a unique feature of the present invention, a sulfur-containing gas is used in place of the oxygen plasma to strip away the photoresist layer 78 and the optional organic BARC layer. This sulfur-containing gas reacts with the first and second low dielectric constant layers 62 and 70. The reaction of the sulfur-containing gas with the organic or carbon-doped materials results in a sulfating or sulfonating action. The result of the reaction is the formation of a sulfur-containing sidewall passivation layer 82 on the sidewalls of the low dielectric constant layers 62 and 70.

The bowing problem, encountered in the prior art example, is prevented in the present invention. The anisotropic etching profile is maintained. In addition, the sulfur-containing sidewall passivation layer 82 can trap copper that may be released during the subsequent etch through of the first passivation layer 58. This prevents copper diffusion into the low dielectric constant layers 62 and 70. Finally, via poisoning problems are prevented by the presence of the sidewall passivation layer 82.

The sulfur-containing gas may be applied using plasma to etch the photoresist. The plasma is generated in a reaction chamber at a temperature of between about 20 degrees C. and 300 degrees C. and a pressure of between about 0.01 Torr and 20 Torr. Microwave or RF power is capacitively coupled to the plasma at an energy of between about 100 Watts and 5,000 Watts.

Alternatively, the sulfur-containing gas, can be applied without plasma. The etching temperature is between about 20 degrees C. and 300 degrees C. The pressure is maintained at between about 0.1 Torr and 760 Torr.

The sulfur-containing gas comprises sulfur dioxide ($SO_2$), sulfur trioxide ($SO_3$), or a mixture of sulfur dioxide and sulfur trioxide. The sidewall passivation layer 82 formed by the sulfating or sulfonating reaction has a thickness of between about 5 Angstroms and 100 Angstroms. The present invention forms the sidewall passivation layer 82 at a relatively low temperature. The novel approach of the present invention forms the advantageous sidewall passivation layer 82 without any additional processing steps.

As a further alternative, oxygen gas may be added to the sulfur-containing gas in the same reaction chamber conditions, with or without plasma generation. In this case, the ratio of the flow rate of oxygen to the flow rate of the sulfur-containing gas is between about 1:1000 and 1:1.

Yet another alternative is to sequentially etch, first with the sulfur-containing gas, then with oxygen plasma. In this alternative, the sulfur-containing gas radicals passivate the sidewalls of the dielectric layers 70 and 62 and partially strip the photoresist layer 78 and the BARC layer. The passivation layer 82, thus formed, prevents the oxygen plasma radicals from attacking the first and second low dielectric constant layers 62 and 70.

Figure 7:
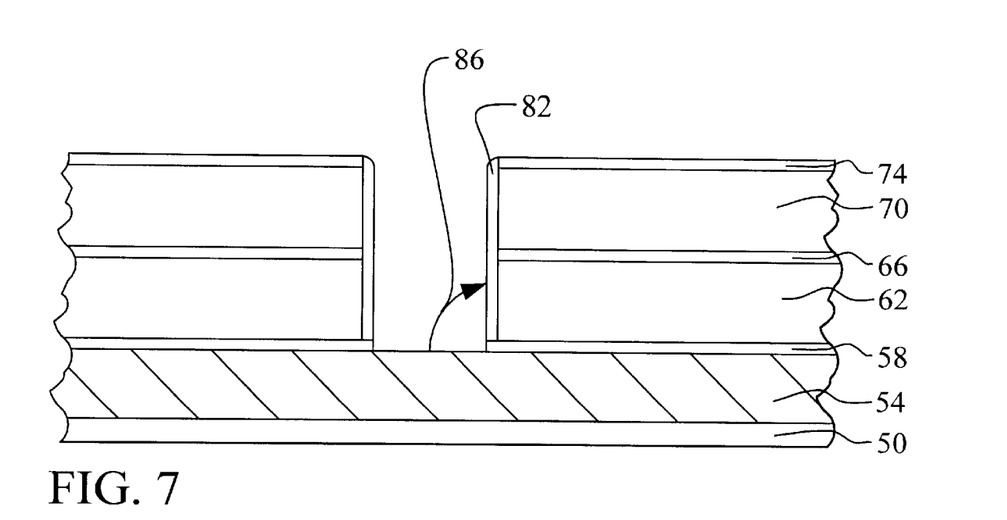

Referring now to FIG. 7, the first passivation layer 58 is etched through to expose the underlying copper conductors 54. During the etching process, some of the copper may be sputtered 86 onto the passivation layer 82 on the sidewalls and the top of the capping layer 74. In the prior art, the copper ions would typically diffuse into the low dielectric constant layers 62 and 70. In the present invention, however, the presence of the sidewall passivation layer 82 prevents copper diffusion by trapping the copper ions.

Figure 8:
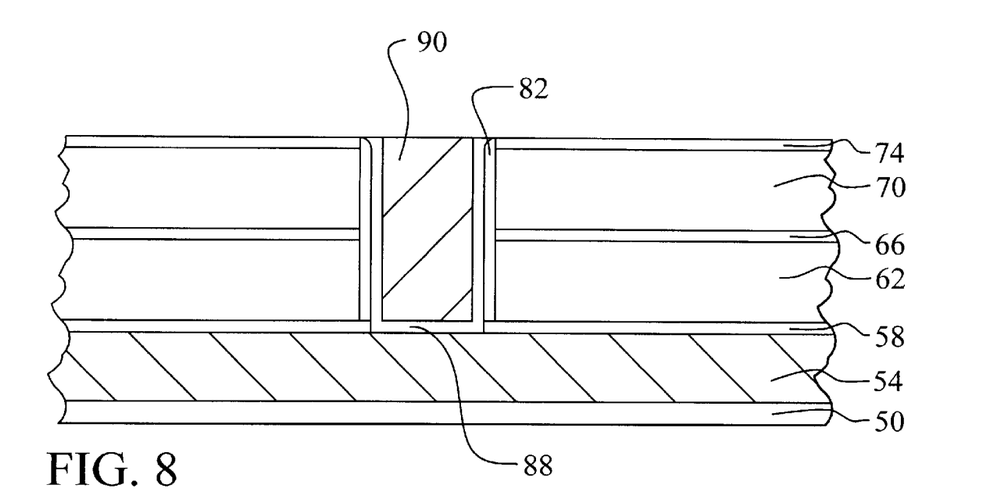

Referring now to FIG. 8, the single damascene interconnects are completed. A barrier metal layer 88 is be deposited overlying the sidewall passivation layer 82 and the copper conductors 54 and filling the trenches. A copper layer 90 is then deposited overlying the barrier layer 88 and filling the via or trench openings. The barrier metal layer comprises, for example, tantalum nitride, titanium nitride, tungsten nitride, or tantalum. The copper layer 90 may be deposited by a physical vapor deposition (PVD), a chemical vapor deposition (CVD), or by a plating process. The copper layer is then polished down to the top surface of the capping layer 74 to complete the single damascene interconnects in the manufacture of the integrated circuit device. The polishing down process would comprise a chemical mechanical polishing (CMP) process. The capping layer 74 serves as a polishing stop.

Figure 9:
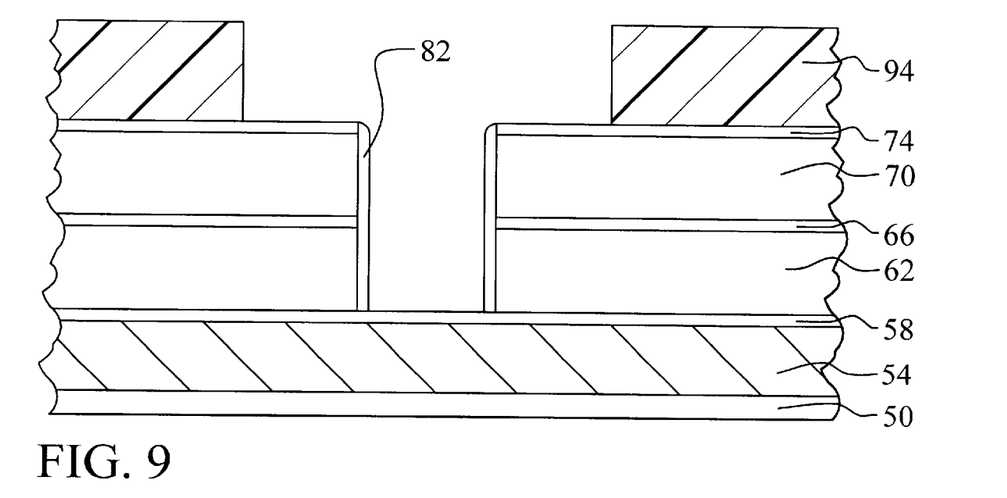
FIGS. 9 through 13 schematically illustrate in cross-sectional representation the preferred embodiment of the present invention applied to the fabrication of a dual damascene interconnect.

Referring now to FIG. 9, the present invention is applied to the creation of a dual damascene interconnect. In this case, the etched opening of FIGS. 5 and 6 would comprise the via opening. Continuing the process after the stripping and sidewall passivation step shown in cross-section of FIG. 6, a second photoresist layer 94 is deposited overlying the optional capping layer 74. An optional BARC layer may be deposited overlying the second photoresist layer 94. The second photoresist layer 94 is patterned to form openings for the interconnect trenches. The second photoresist layer may be patterned using a typical photolithographic process where it is exposed to light through a mask. A developing process removes the undesired second photoresist layer 94 to expose the capping layer 74, or the optional BARC layer, where the trenches are planned.

Figure 10:
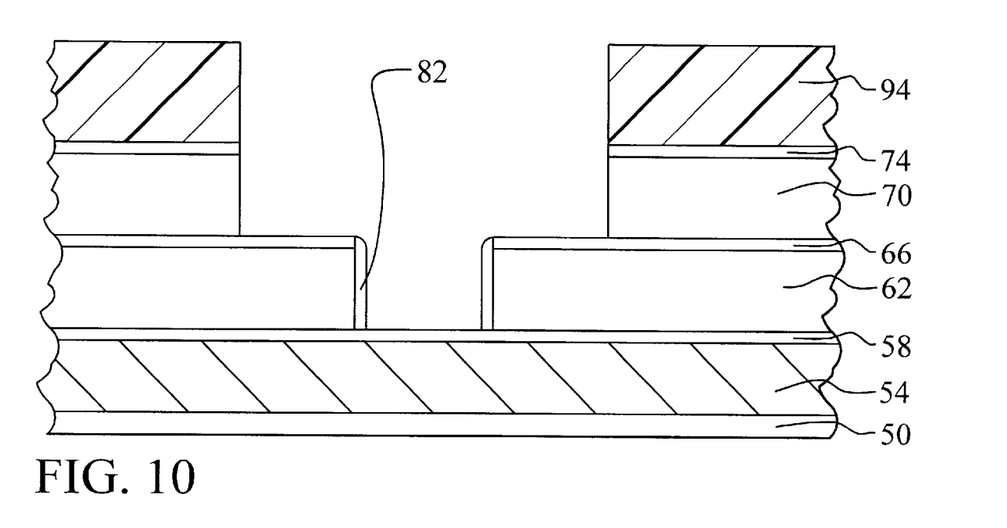

Referring now to FIG. 10, the optional BARC layer, the optional capping layer 74 and the second low dielectric constant layer 70 are etched through to form the interconnect trench. This etching is performed using an anisotropic, plasma-assisted dry etch. Note that the etch is stopped at the etch stop layer 66. Here the use of the optional etch stop layer 66 facilitates easier formation of separate interconnect and via levels in the dual damascene structure.

Figure 11:
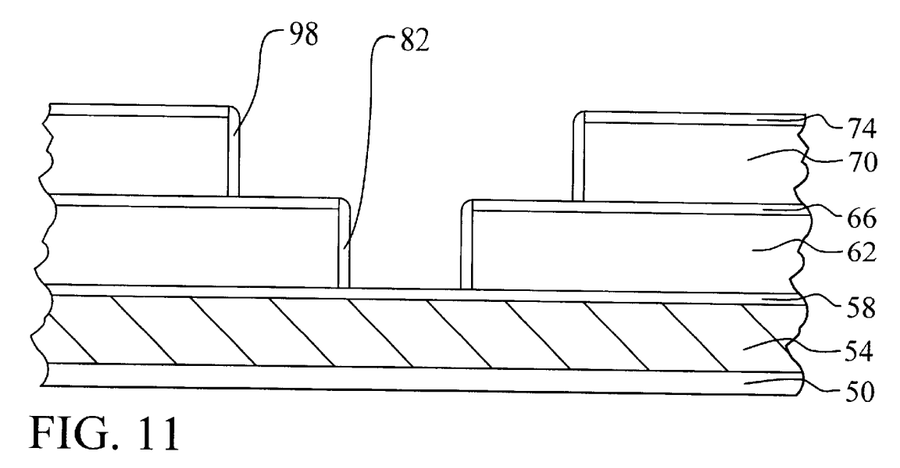

Referring now to FIG. 11, an important aspect of the present invention is described. The photoresist layer 94 is stripped away while a second sidewall passivation layer 98 is formed on the sidewalls of the interconnect trench. The photoresist layer 94 is stripped using a sulfur-containing gas.

This sulfur-containing gas reacts primarily with the now exposed second low dielectric constant layer 70. The reaction of the sulfur-containing gas with the organic or carbon-doped materials results in a sulfating or sulfonating action. The result of the reaction is the formation of a second sidewall passivation layer 98 on the sidewalls of the second low dielectric constant layer 70.

The sulfur-containing gas may be applied using plasma to etch the second photoresist layer 94. This plasma would be generated in a reaction chamber at a temperature of between about 20 degrees C. and 300 degrees C. and a pressure of between about 0.01 Torr and 20 Torr. Microwave or RF power is capacitively coupled to the plasma at an energy of between about 100 Watts and 5,000 Watts.

Alternatively, the sulfur-containing gas can be applied without plasma. The etching temperature is between about 20 degrees C. and 300 degrees C. The pressure is maintained at between about 0.1 Torr and 760 Torr.

The sulfur-containing gas comprises sulfur dioxide ($SO_2$), sulfur trioxide ($SO_3$), or a mixture of sulfur dioxide and sulfur trioxide. The second sidewall passivation layer 98 formed by the sulfating or sulfonating reaction has a thickness of between about 5 Angstroms and 100 Angstroms. The present invention forms the second sidewall passivation layer 98 at a relatively low temperature. The novel approach of the present invention forms the advantageous second sidewall passivation layer 98 without any additional processing steps.

As a further alternative, oxygen gas may be added to the sulfur-containing gas in the same reaction chamber conditions, with or without plasma generation. In this case, the ratio of the flow rate of oxygen to the flow rate of the sulfur-containing gas is between about 1:1000 and 1:1.

Yet another alternative is to sequentially etch, first with the sulfur-containing gas, and then with oxygen plasma. In this alternative, the sulfur-containing gas radicals passivate the sidewalls of the dielectric layer 70 to form the second passivation layer 98 while partially stripping the second photoresist layer 94 and the optional BARC. layer. The second passivation layer 98, along with the previously formed passivation layer 82, thus formed, prevent the oxygen plasma radicals from attacking the first and second low dielectric constant layers 62 and 70.

The bowing problem is again prevented while the anisotropic etching profile is maintained. In addition, the second sidewall passivation layer 98 can trap copper and copper compounds that may be sputtered during the subsequent etch through of the first passivation layer 58. Finally, via poisoning problems are prevented by the presence of the second sidewall passivation layer 98.

Figure 12:
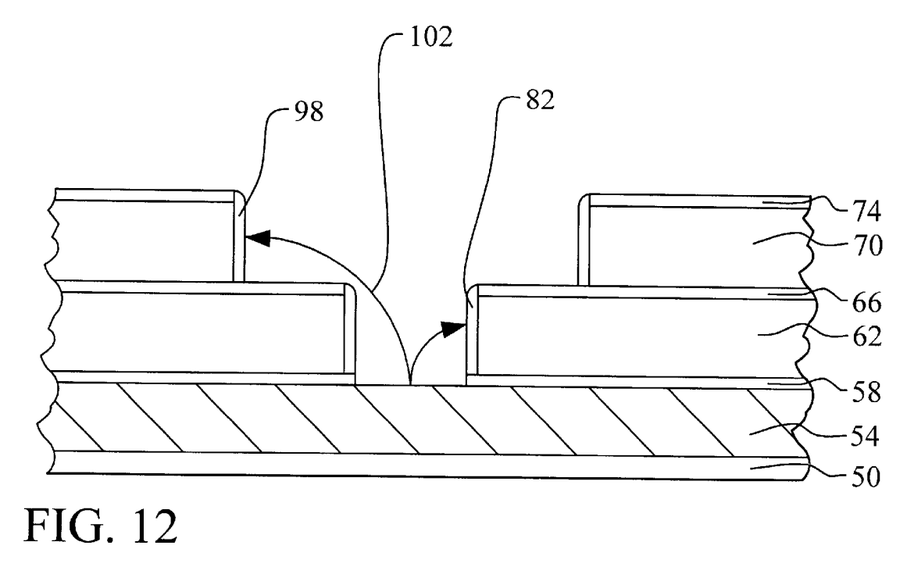

Referring now to FIG. 12, the first passivation layer 58 is etched through to expose the underlying copper conductors 54. During the etching process, some of the copper or copper compounds may be sputtered 102 onto the sidewalls and possibly the top of the capping layer 74 and the optional etch stop layer 66. In the prior art, the copper ions would typically diffuse into the low dielectric constant layers 62 and 70. In the present invention, however, the presence of the first sidewall passivation layer 82 and the second sidewall passivation layer 98 prevents copper diffusion by trapping the copper ions.

Figure 13:
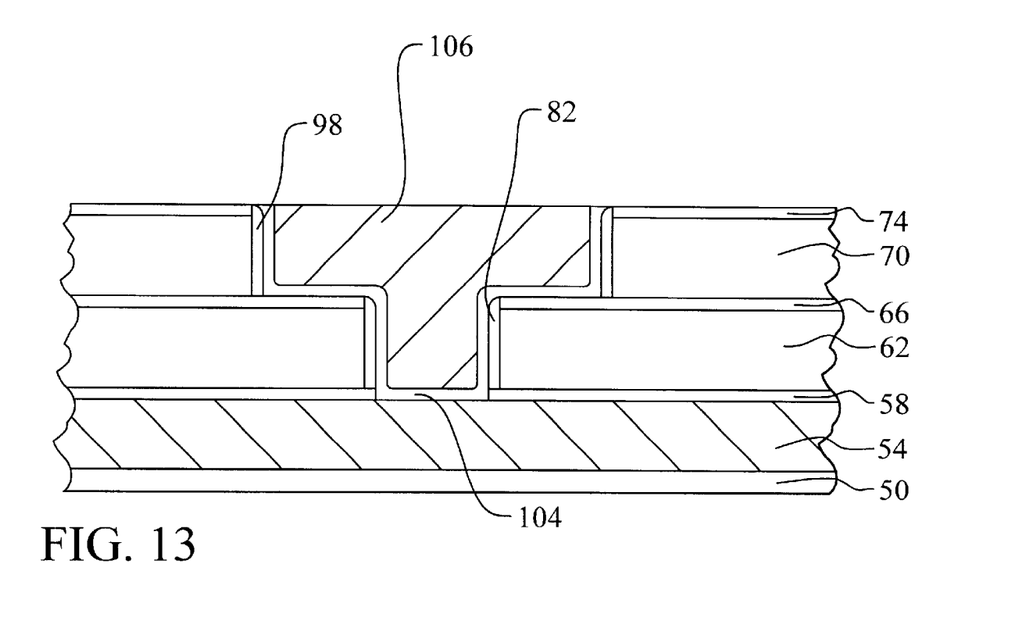

Referring now to FIG. 13, the dual damascene interconnects are completed. A barrier metal layer 104 is deposited through vapor deposition overlying the first sidewall passivation layer 82, the second sidewall passivation layer 98 and the optional etch stop layer 66 and thereby lining the trenches. A copper layer 106 is deposited overlying the barrier metal layer 104 and filling the via and interconnect openings. This barrier metal layer 104 would comprise, for example, tantalum nitride, tantalum, tungsten nitride, or titanium nitride. The copper layer 106 is deposited by vapor deposition and electroplating and is then polished down to the top surface of the capping layer 74 to complete the dual damascene interconnects in the manufacture of the integrated circuit device. The polishing down process would comprise a chemical mechanical polishing (CMP) process. The capping layer 74 serves as a polishing stop.

As shown in the preferred embodiment, the present invention provides a very manufacturable process for forming single or dual damascene interconnects. The novel formation of a sulfur-containing sidewall passivation on the sidewalls of the damascene openings prevents bowing and via poisoning due to the oxygen plasma process used to strip photoresist. The method creates this sidewall passivation by using a sulfur-containing gas to strip photoresist. No additional processing steps are therefore required.

While the invention has been particularly shown and described with reference to the preferred embodiments thereof, it will be understood by those skilled in the art that various changes in form and details may be made without departing from the spirit and scope of the invention. At the same time, it is evident that the same methods may be employed in other, similar process steps that are to numerous to cite. For example, the approach of the present invention may be extended and applied to the formation of triple-level, or greater, damascene structures without departing from the spirit and scope of the invention.

Furthermore, the dual damascene structure that is illustrated herein is formed "via first." The structure can also be formed "trench first" or by using a "self-aligned via" technique or by another well-known technique of the art without departing from the scope and spirit.

What is claimed is:

1. A method to form damascene interconnects in the manufacture of an integrated circuit device comprising:
   providing copper conductors overlying a semiconductor substrate;
   providing a first passivation layer overlying said copper conductors;
   depositing a low dielectric constant layer overlying said first passivation layer;
   depositing a photoresist layer overlying said low dielectric constant layer;
   patterning said photoresist layer to form a via mask;
   thereafter etching through said low dielectric constant layer to form said via openings;
   simultaneously stripping away said photoresist layer and forming a sidewall passivation layer on the sidewalls of said via openings by using a sulfur-containing gas;
   etching through said first passivation layer to expose underlying said copper conductors;
   depositing a barrier metal layer overlying said first passivation layer and filling said via openings;
   depositing a copper layer overlying said barrier metal layer and filling said via openings; and
   polishing down said copper layer to complete said damascene interconnects in the manufacture of the integrated circuit device.

2. The method according to claim 1 wherein said damascene interconnects comprises one of the group of: single damascene interconnects and dual damascene interconnects.

3. The method according to claim 1 wherein said low dielectric constant layer comprises one of the group of: porous organic materials, non-porous organic materials, porous fluorinated organic materials, non-porous fluorinated organic materials, porous carbon-doped silicon dioxide, non-porous carbon-doped silicon dioxide, porous hydrogen-doped silicon dioxide, and non-porous hydrogen-doped silicon dioxide.

4. The method according to claim 1 wherein said first passivation layer comprises one of the group of silicon nitride, silicon oxynitride, copper barrier low k film Blok™ by Applied Materials, silicon carbide, and boron nitride.

5. The method according to claim 1 further comprising depositing a capping layer after said step of depositing a low dielectric constant layer and prior to said step of depositing a photoresist layer wherein said capping layer comprises one of the group of: silicon nitride, silicon oxynitride, and silicon carbide.

6. The method according to claim 1 wherein said sulfur-containing gas comprises one of the group of: sulfur dioxide, sulfur trioxide, and a mixture of sulfur dioxide and sulfur trioxide.

7. The method according to claim 1 wherein said step of simultaneously stripping away said photoresist layer is performed without a plasma at a temperature of between about 20 degrees C. and 300 degrees C. and a pressure of between about 0.1 Torr and 760 Torr.

8. The method according to claim 7 further comprising adding oxygen gas to said sulfur-containing gas wherein the ratio of the flow rate of said oxygen gas to the flow rate of said sulfur-containing gas is between about 1:1000 and 1:1.

9. The method according to claim 1 wherein said step of simultaneously stripping away said photoresist layer is performed with a plasma wherein said plasma is generated at a temperature of between about 20 degrees C. and 300 degrees C., a pressure of between about 0.01 Torr and 20 Torr, and an energy of between about 100 Watts and 5,000 Watts.

10. The method according to claim 9 further comprising adding oxygen gas to said sulfur-containing gas wherein the ratio of the flow rate of said oxygen gas to the flow rate of said sulfur-containing gas is between about 1:1000 and 1:1.

11. A method to form damascene interconnects in the manufacture of an integrated circuit device comprising:
   providing copper conductors overlying a semiconductor substrate;
   providing a first passivation layer overlying said copper conductors;
   depositing a low dielectric constant layer overlying said first passivation layer;
   depositing a capping layer overlying said low dielectric constant layer;
   depositing a photoresist layer overlying said capping layer;
   patterning said photoresist layer to form a via mask;
   thereafter etching through said capping layer and said low dielectric constant layer to form said via openings;
   simultaneously stripping away said photoresist layer and forming a sidewall passivation layer on the sidewalls of said via openings by using a sulfur-containing gas wherein said sulfur-containing gas comprises one of the group of: sulfur dioxide, sulfur trioxide, and a mixture of sulfur dioxide and sulfur trioxide;
   etching through said first passivation layer to expose underlying said copper conductors;
   depositing a barrier metal layer overlying said capping layer and lining said via openings;
   depositing a copper layer overlying said barrier metal layer and filling said via openings; and
   polishing down said copper layer to complete said damascene interconnects in the manufacture of the integrated circuit device.

12. The method according to claim 11 wherein said damascene interconnects comprises one of the group of: single damascene interconnects and dual damascene interconnects.

13. The method according to claim 11 wherein said low dielectric constant layer comprises one of the group of: porous organic materials, non-porous organic materials, porous fluorinated organic materials, non-porous fluorinated organic materials, porous carbon-doped silicon dioxide, non-porous carbon-doped silicon dioxide, porous hydrogen-doped silicon dioxide, and non-porous hydrogen-doped silicon dioxide.

14. The method according to claim 11 wherein said first passivation layer comprises one of the group of silicon nitride, silicon oxynitride, copper barrier low k film Blok™ by Applied Materials, silicon carbide, and boron nitride.

15. The method according to claim 11 wherein said capping layer comprises one of the group of: silicon nitride, silicon oxynitride, and silicon carbide.

16. The method according to claim 11 wherein said step of simultaneously stripping away said photoresist layer is performed without a plasma at a temperature of between about 20 degrees C. and 300 degrees C. and a pressure of between about 0.1 Torr and 760 Torr.

17. The method according to claim 16 further comprising adding oxygen gas to said sulfur-containing gas wherein the ratio of the flow rate of said oxygen gas to the flow rate of said sulfur-containing gas is between about 1:1000 and 1:1.

18. The method according to claim 11 wherein said step of simultaneously stripping away said photoresist layer is performed with a plasma wherein said plasma is generated at a temperature of between about 20 degrees C. and 300 degrees C., a pressure of between about 0.01 Torr and 20 Torr, and an energy of between about 100 Watts and 5,000 Watts.

19. The method according to claim 18 further comprising adding oxygen gas to said sulfur-containing gas wherein the ratio of the flow rate of said oxygen gas to the flow rate of said sulfur-containing gas is between about 1:1000 and 1:1.

20. A method to form dual damascene interconnects in the manufacture of an integrated circuit device comprising:

providing copper conductors overlying a semiconductor substrate;

providing a first passivation layer overlying said copper conductors;

depositing a first low dielectric constant layer overlying said first passivation layer;

depositing a second low dielectric constant layer overlying said first low dielectric constant layer;

depositing a first photoresist layer overlying said second low dielectric constant layer;

patterning said first photoresist layer to form a via mask;

thereafter etching through said second low-dielectric constant layer and said first low dielectric constant layer to form via openings;

simultaneously stripping away said first photoresist layer and forming a first sidewall passivation layer on the sidewalls of said via openings by using a sulfur-containing gas;

thereafter depositing a second photoresist layer overlying said second low dielectric constant layer;

patterning said second photoresist layer to form an interconnect mask;

thereafter etching through said second low dielectric constant layer to form interconnect openings;

simultaneously stripping away said second photoresist layer and forming a second sidewall passivation layer on said sidewalls of said via openings and on the sidewalls of said interconnect openings by using a sulfur-containing gas;

etching through said first passivation layer to expose underlying said copper conductors;

depositing a barrier metal layer overlying said capping layer and lining said via openings;

depositing a copper layer overlying said barrier metal layer and filling said interconnect openings and said via openings; and polishing down said copper layer to complete said dual damascene interconnects in the manufacture of the integrated circuit device.

21. The method according to claim 20 wherein said first low dielectric constant layer comprises one of the group of: porous organic materials, non-porous organic materials, porous fluorinated organic materials, non-porous fluorinated organic materials, porous carbon-doped silicon dioxide, non-porous carbon-doped silicon dioxide, porous hydrogen-doped silicon dioxide, and non-porous hydrogen-doped silicon dioxide.

22. The method according to claim 21 further comprising adding oxygen gas to said sulfur-containing gas wherein the ratio of the flow rate of said oxygen gas to the flow rate of said sulfur-containing gas is between about 1:1000 and 1:1.

23. The method according to claim 20 wherein said second low dielectric constant layer comprises one of the group of: porous organic materials, non-porous organic materials, porous fluorinated organic materials, non-porous fluorinated organic materials, porous carbon-doped silicon dioxide, non-porous carbon-doped silicon dioxide, porous hydrogen-doped silicon dioxide, and non-porous hydrogen-doped silicon dioxide.

24. The method according to claim 20 wherein said first passivation layer comprises one of the group of silicon nitride, silicon oxynitride, copper barrier low k film Blok™ by Applied Materials, silicon carbide, and boron nitride.

25. The method according to claim 20 further comprising depositing an etch stopping layer overlying said first low dielectric constant layer prior to said step of depositing said second low dielectric constant layer.

26. The method according to claim 20 further comprising depositing a capping layer overlying said second low dielectric constant layer prior to said step of depositing said first photoresist layer.

27. The method according to claim 20 wherein said sulfur-containing gas comprises one of the group of: sulfur dioxide, sulfur trioxide, and a mixture of sulfur dioxide and sulfur trioxide.

28. The method according to claim 20 wherein said step of simultaneously stripping away said photoresist layer is performed without a plasma at a temperature of between about 20 degrees C. and 300 degrees C. and a pressure of between about 0.1 Torr and 760 Torr.

29. The method according to claim 20 wherein said step of simultaneously stripping away said photoresist layer is performed with a plasma wherein said plasma is generated at a temperature of between about 20 degrees C. and 300 degrees C., a pressure of between about 0.01 Torr and 20 Torr, and an energy of between about 100 Watts and 5,000 Watts.

30. The method according to claim 29 further comprising adding oxygen gas to said sulfur-containing gas wherein the ratio of the flow rate of said oxygen gas to the flow rate of said sulfur-containing gas is between about 1:1000 and 1:1.

* * * * *